(12) United States Patent
Kapoor et al.

(10) Patent No.: US 10,739,846 B2
(45) Date of Patent: Aug. 11, 2020

(54) CLOSED-LOOP ADAPTIVE VOLTAGE, BODY-BIASING AND FREQUENCY SCALING

(71) Applicant: NXP B.V., Eindhoven (NL)

(72) Inventors: Ajay Kapoor, Eindhoven (NL); Juan Diego Echeverri Escobar, Veldhoven (NL); Kristof Blutman, Eindhoven (NL); Sebastien Antonius Josephus Fabrie, Eindhoven (NL); Jose de Jesus Pineda de Gyvez, Eindhoven (NL); Hamed Fatemi, Eindhoven (NL)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 16/215,780

(22) Filed: Dec. 11, 2018

(65) Prior Publication Data
US 2020/0183486 A1 Jun. 11, 2020

(51) Int. Cl.
 *H03L 5/00* (2006.01)
 *G06F 1/3296* (2019.01)
 *H03K 3/03* (2006.01)

(52) U.S. Cl.
 CPC .......... *G06F 1/3296* (2013.01); *H03K 3/0315* (2013.01)

(58) Field of Classification Search
 CPC .............................. G06F 1/3296; H03K 3/0315
 USPC ........................................................ 327/306
 See application file for complete search history.

(56) References Cited

U.S. PATENT DOCUMENTS

| | | | |
|---|---|---|---|
| 8,269,545 B2 | 9/2012 | Chawla et al. | |
| 8,451,043 B2 | 5/2013 | Baumann et al. | |
| 8,801,281 B1 | 8/2014 | Chan et al. | |
| 9,436,253 B2 | 9/2016 | Lee et al. | |
| 9,502,956 B1* | 11/2016 | Yeo | H02M 1/36 |
| 2002/0029352 A1* | 3/2002 | Borkar | G06F 1/26 |
| | | | 713/320 |
| 2005/0218871 A1 | 10/2005 | Kang et al. | |
| 2007/0192650 A1 | 8/2007 | Shiota | |
| 2011/0099562 A1 | 4/2011 | Nandy et al. | |
| 2013/0297094 A1 | 11/2013 | Yao et al. | |
| 2016/0077572 A1 | 3/2016 | Chang | |

(Continued)

OTHER PUBLICATIONS

Beigne, E. et al., "Fine-grain DVFS and AVFS techniques for complex SoC design: An overview of architectural solutions through technology nodes," 2015 IEEE International Symposium on Circuits and Systems (ISCAS); ISBN: 978-1-4799-8391-9; May 24-27, 2015; pp. 1550-1553.

(Continued)

*Primary Examiner* — Metasebia T Retebo

(57) ABSTRACT

An electronic device includes a digital circuit, a power delivery subsystem configured to provide a supply voltage and a body-biasing voltage to the digital circuit, and a controller a controller coupled to the power delivery subsystem. The controller is configured to determine a process parameter for the electronic device, determine a current temperature parameter for the electronic device, concurrently determine a first coarse-grain level for the supply voltage and a second coarse-grain level for the body-biasing voltage based on the process parameter, the current temperature parameter, and a frequency of a clock signal to be supplied to the digital circuit, and to determine a fine-grain level for the supply voltage.

18 Claims, 5 Drawing Sheets

(56) References Cited

U.S. PATENT DOCUMENTS

2018/0123604 A1    5/2018  Raja et al.

OTHER PUBLICATIONS

Dreslinski, Ronald G. et al., "Near-Threshold Computing: Reclaiming Moore's Law Through Energy Efficient Integrated Circuits", Proceedings of the IEEE, Jan. 20, 2010, pp. 253-266, vol. 98, No. 2, IEEE, Piscataway, NJ, USA.
Kidd, David, "Process and Circuit Optimization for Power Reduction Using DDC Transistors", IEEE Micro, Mar. 1, 2014, pp. 54-62, vol. 34, No. 2, IEEE Service Center, Los Alamitos, CA, USA.

* cited by examiner

CLOSED-LOOP ADAPTIVE VOLTAGE, BODY-BIASING AND FREQUENCY SCALING

BACKGROUND

Dynamic voltage and frequency scaling (DVFS) techniques typically operate to tune a supplied voltage to reduce the power consumption of a digital device while meeting performance expectations. Conventional DVFS techniques take either a set-once approach or an iterative-only approach to configuring a supplied voltage for a specified operating frequency. In the set-once approach, the device employs a look-up table (LUT) to determine the supply voltage level for a detected process parameter and temperature parameter, and then fixes the voltage supply to the voltage level specified by the LUT until a temperature change or frequency change is indicated. While a supply voltage level can be configured relatively quickly using this approach, the voltage levels employed in the LUT typically are relatively coarse and provide excessive margin, and thus the set-once approach tends to result in excess power consumption. In contrast, in the conventional iterative-only approach, the supplied voltage is iteratively adjusted and at each iteration the voltage level is tested to determine whether the device is operational at that voltage level. Once a voltage level is identified as enabling sufficient operation, the supplied voltage is set to that voltage level. While the iterative-only approach typically provides lower voltage margin and thus reduced power consumption, the number of iterations needed to tune to the appropriate voltage level over a relatively wide range can be problematic, as can the energy change required to change the voltage level over the entire device between each iteration for this wide range. Such iterative-only approaches are also susceptible to stability and overshoot issues due to their relatively wide search ranges.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Conventional DVFS techniques implement either a set-once approach for setting the voltage level for a given frequency, which can result in excessive voltage margin and thus excessive power consumption, or a wide-range iteration approach that typically requires a relatively large number of iterations, and thus can consume excessive time. In contrast, embodiments of the techniques described herein provide for a combined coarse-fine adaptive voltage approach in which a LUT-based coarse-grain tuning process determines a coarse voltage level for a supplied voltage, and then an iterative fine-grain tuning process fine-grain tunes the coarse voltage level over a relatively narrow range. This combined approach results in relatively fast voltage level tuning with improved margin. Moreover, conventional DVFS techniques typically provide adaptive control only for the voltage supply (VDD). However, fully-depleted silicon-on-insulator (FDSOI) transistor-based designs and similar transistor architectures can benefit from co-dependent tuning of both the voltage supply VDD and the body bias voltage (VBB) for one or both of the p-type metal oxide silicon (PMOS) transistors or the n-type MOS (NMOS) transistors of the design. The techniques described herein facilitate concurrently tuning of both VDD voltages and VBB voltages, and thus the overall approach described herein is referred to generally as "adaptive voltage, body-biasing, and frequency scaling" or "AVBFS".

Figure 1:
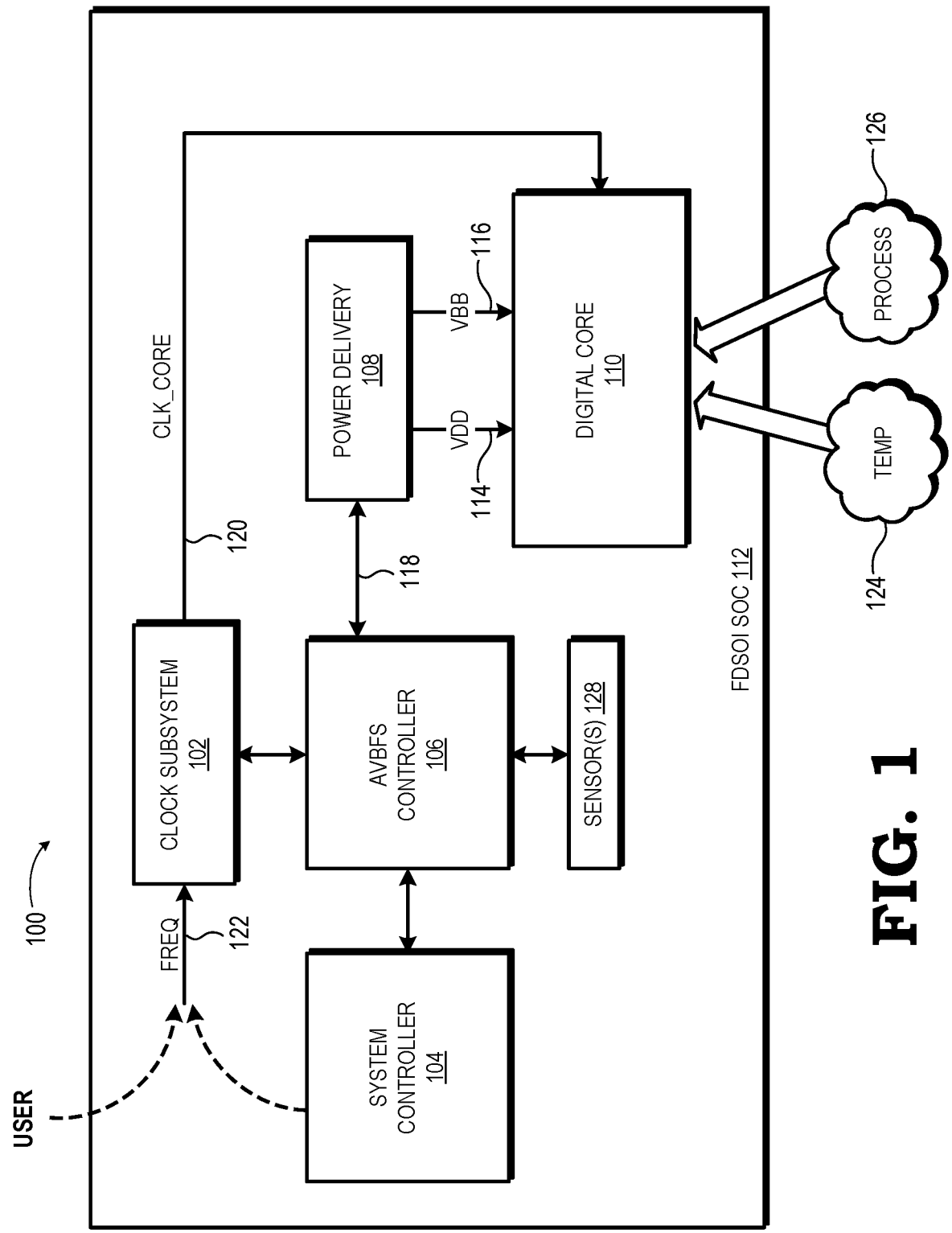
FIG. 1 is a block diagram of an electronic device employing an adaptive voltage, body-bias, and frequency scaling (AVBFS) technique in accordance with some embodiments.

FIG. 1 illustrates an electronic device 100 employing an AVBFS technique for dynamically adapting one or both of a supply voltage VDD or a body-biasing voltage (VBB) in accordance with some embodiments. The electronic device 100 includes a clock subsystem 102, a system controller 104, an AVBFS controller 106, a power delivery subsystem 108, and a digital core 110. These components are implemented as one or more integrated circuit (IC) chips disposed at or more motherboards or other interconnect substrates. To illustrate, in the depicted embodiment, the electronic device 100 is implemented as a system on a chip (SOC) 112 including some or all of the IC chips of the electronic device 100.

The digital core 110 includes one or more transistor-based digital circuits configured to implement one or more processing functions for the electronic device 100. In at least one embodiment, some or all of the transistors of the digital core 110 are fabricated using an FDSOI fabrication process or similar fabrication process that results in transistors that can benefit from both VDD and VBB tuning. The power delivery subsystem 108 is configured to supply various voltages to the digital core 110, including a supply voltage VDD (voltage 114) and at least one body-biasing voltage VBB (voltage 116), based on voltage control signaling 118 provided by the AVBFS controller 106. The power delivery subsystem 108 thus may include a voltage regulator (not shown), such as a low-drop-out (LDO) voltage regulator, for each supplied voltage. The clock subsystem 102 is configured to provide one or more clock signals for distribution to the other components of the SOC 112, including a clock signal 120 ("CLK_CORE") distributed to the digital core 110 and having a frequency FREQ configurable via a frequency control input 122. In some embodiments, the frequency FREQ is user-configurable via a client-accessible register or other configuration input. In other embodiments, the system controller 104 or other component of the electronic device 100 determines upcoming workload requirements and sets the frequency accordingly. The system controller 104 is configured to initialize the electronic device 100 following boot-up or other reset trigger, as well as to control the various components of the electronic device 100 as described in greater detail herein.

The AVBFS controller 106 is configured to control the power delivery subsystem 108 via the control signaling 118 to tune one or both of the supply voltage VDD and the at least one body-biasing voltage VBB provided to the digital core 110 based on the current operational characteristics of the electronic device 100, which include the frequency FREQ of the clock signal CLK_CORE supplied to the digital core 110, a current temperature parameter 124 at the digital core 110, and a process parameter 126 (that is, process corner) for the particular instantiation of the digital core 110. In at least one embodiment the AVBFS controller 106 employs an AVBFS technique in which a closed-loop algorithm considers these operational characteristics to adjust both the supply voltage VDD and the body-biasing voltage VBB in concert so as to reduce or minimize excess margin while meeting the switching requirements at the specified frequency FREQ. To this end, in at least one embodiment the AVBFS technique employs a two-staging tuning approach: a coarse-grain tuning stage in which the voltages VDD and VBB are coarsely tuned based on process and temperature parameters detected using one or more sensors 128; and a fine-grain tuning stage following the coarse-grain tuning stage in which at least the voltage VDD is finely tuned based on an iterative tuning approach over a relatively small range. In some embodiments, the voltage VBB is finely tuned at the fine-grained tuning stage using the same approach employed for the voltage VDD. This two-stage approach provides for relatively fast settling of the voltages VDD and VBB while providing relatively small error margins, and thus strikes a suitable balance between speed of configuration and elimination of excess voltage margin.

Figure 2:
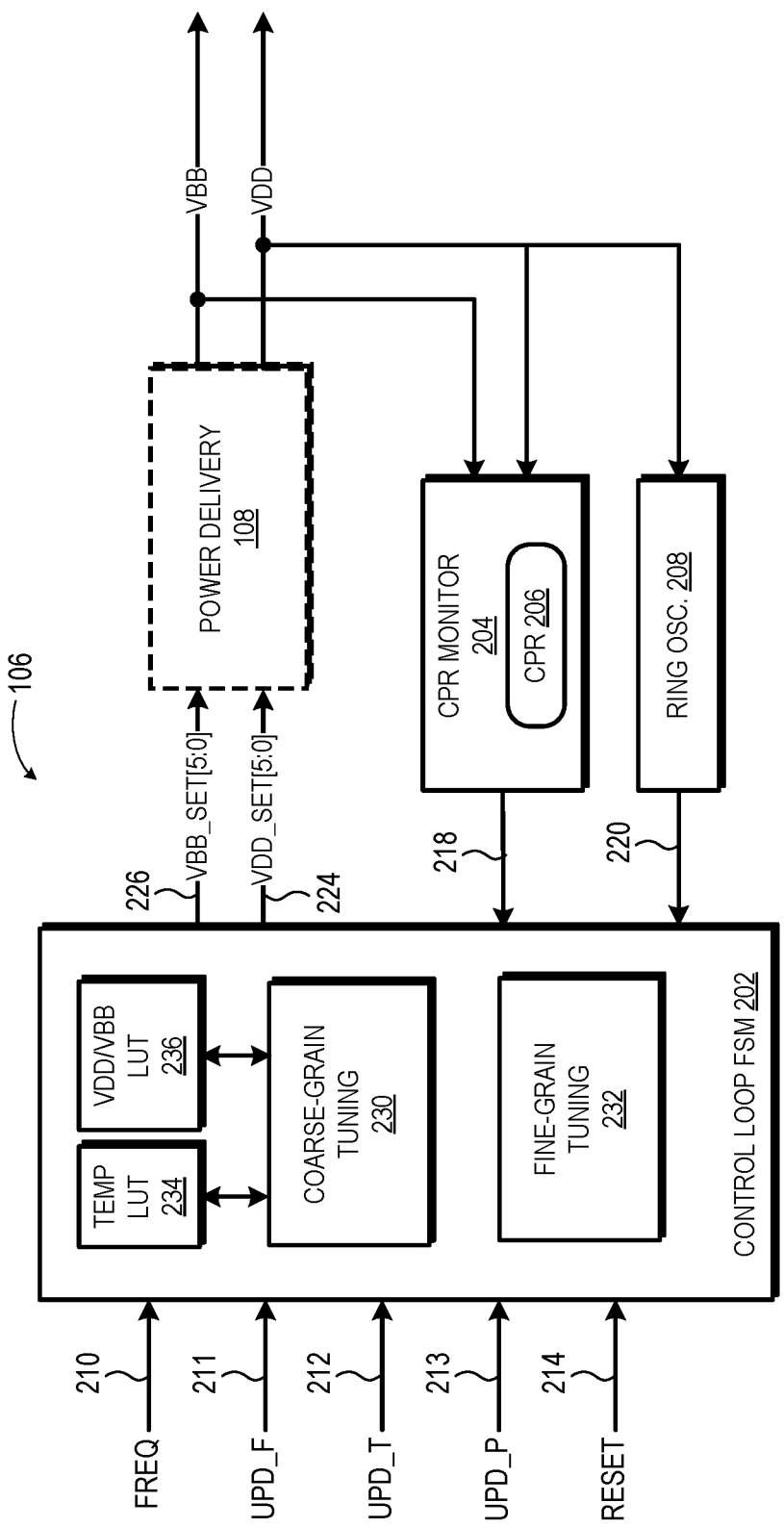
FIG. 2 is a block diagram illustrating an AVBFS controller of the electronic device of FIG. 1 in accordance with some embodiments.

FIG. 2 illustrates an example implementation of the AVBFS controller 106 in accordance with some embodiments. The AVBFS controller 106 includes a control loop finite state machine (FSM) 202 implemented in hardcoded logic, programmable logic, or a combination thereof, a critical path replica (CPR) monitor 204 implementing a replica circuit of a critical circuit path in the digital core 110 (CPR 206), and a ring oscillator 208. In this instance, the CPR monitor 204 and ring oscillator 208 are embodiments of the sensors 128 of FIG. 1. The control loop FSM 202 includes inputs to receive at least the following signals from the system controller 104: a signal 210 representative of a value of the frequency FREQ to be implemented by the clock subsystem 102, a frequency update enable signal 211 ("UPD_F"), a temperature update enable signal 212 ("UPD_T"), a process update enable signal 213 ("UPD_P"), and, a reset signal 214 ("RESET"). The control loop FSM 202 further includes an input to receive output signaling 218 from the CPR monitor 204 and an input to receive output signaling 220 (typically in the form of an oscillator count) from the ring oscillator 208. The control loop FSM 202 further includes outputs to provide control signaling to the system controller 104. To control the operation of the power delivery subsystem 108, the control loop FSM 202 has outputs to provide the voltage control signaling 118, which in the embodiment of FIG. 2 includes a VDD control signal 224 ("VDD_SET") and a VBB control signal 226 ("VBB_SET").

The control loop FSM 202 utilizes a coarse-grain tuning stage 230 that implements the process for jointly coarse-tuning the voltages VDD and VBB to be supplied by the power delivery subsystem 108, as well as a fine-tuning stage 232 that implements the process for fine-tuning at least the supply voltage VDD, and in some embodiments, both the supply voltage VDD and the body-biasing voltage VBB.

The coarse-grain tuning stage 230 includes, or has access to, a plurality of look-up tables (LUTs), including a temperature LUT 234 used in the process of determining the current temperature parameter 124 and a joint VDD/VBB LUT 236 used in the process of determining a coarse value for each of VDD_SET and VBB_SET.

The CPR monitor 204 includes inputs to receive the supply voltage VDD, the body-biasing voltage VBB, and a clock signal (not shown in FIG. 2), which are used to power and clock the CPR 206. The CPR 206 replicates a critical circuit path in the digital core 110 and thus serves to represent or simulate the operation of the digital core 110 with the supplied voltages and clock signal. The CPR monitor 204 thus includes logic and other circuitry to feed these voltages and clock signal to the CPR 206, as well as to generate the output signaling 218 based on the result of the operation of the CPR 206.

The ring oscillator 208 includes an input to receive the supply voltage VDD and an output to provide the output signaling 220 representing an output count generated by the ring oscillator 208 based on the current level of the supply voltage VDD. The n-type metal oxide semiconductor (MOS) and p-type MOS transistors implementing the ring oscillator may be zero biased, or otherwise biased to a fixed body bias voltage, such as VDD ground. As described in greater detail below, the ring oscillator 208 serves as a sensor for detecting the process parameter 126 for the electronic device 100, and then as a sensor for detecting the current temperature parameters 124. As such, the ring oscillator 208 serves as a single sensor capable of detecting both the process parameter 126 and the temperature parameter 124.

Figure 3:
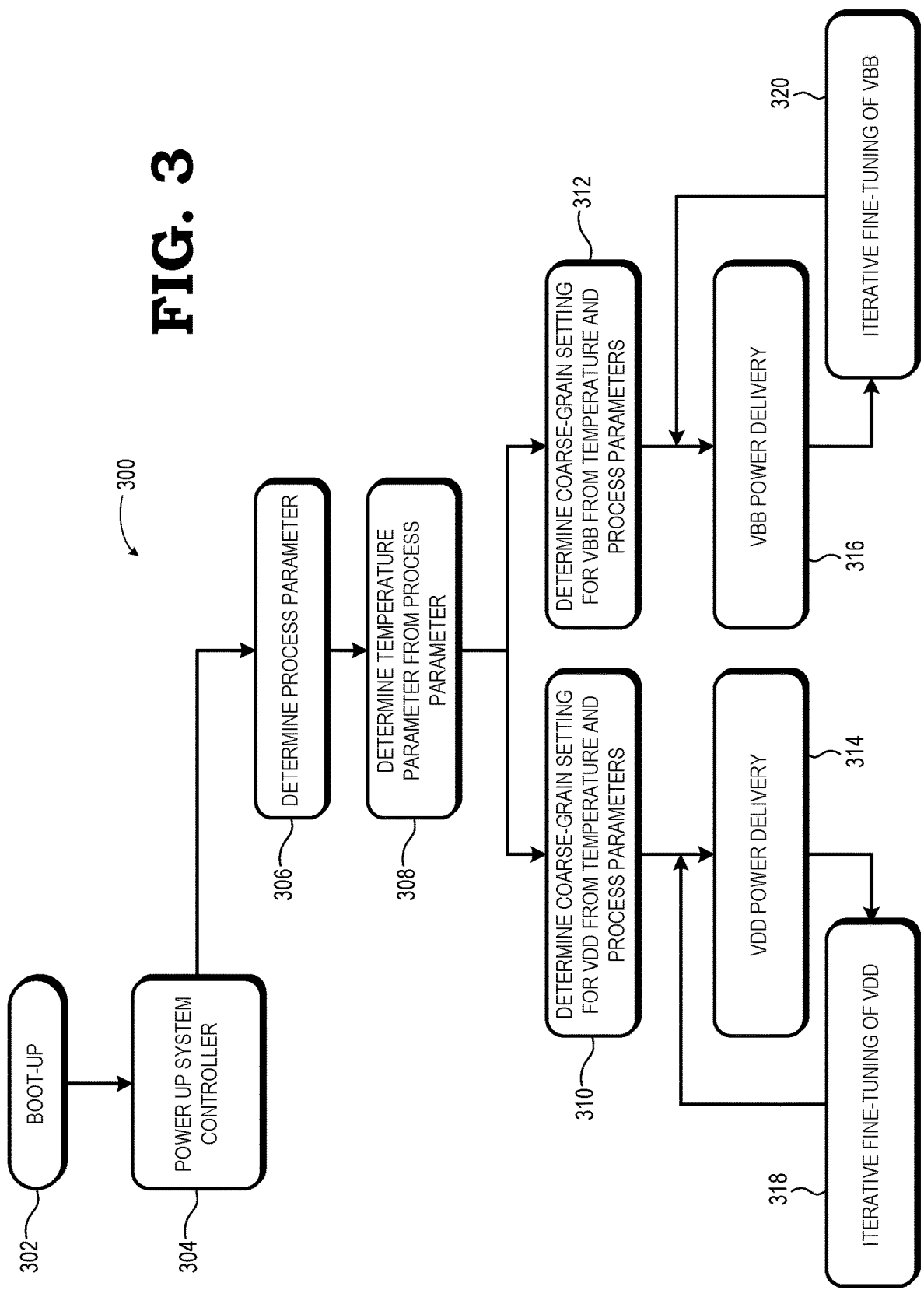
FIG. 3 is a flow diagram illustrating a method of operation of the AVBFS controller of FIG. 2 in accordance with some embodiments.

FIG. 3 illustrates an example method 300 of operation of the AVBFS controller 106 of FIG. 2 in accordance with some embodiments. The method 300 initiates at block 302 with boot-up or other initialization trigger at the electronic device 100. In response, the electronic device 100 powers up the system controller 104, AVBFS controller 106, and power delivery subsystem 108 at block 304. This process includes initiating power and clock sequencing at the power delivery subsystem 108 and clock subsystem 102, respectively, and then resetting the AVBFS controller 106 via assertion of the RESET signal 214. In response to assertion of the RESET signal 214, the AVBFS controller 106 enters into a default configuration for the control loop FSM 202 and for the voltages VDD and VBB supplied by the power delivery subsystem 108, whereby this default configuration provides a stable functional state that can be utilized as a back-up option in the event that the AVBFS control loop fails for some reason.

After a sufficient waiting period after asserting the RESET signal 214, the system controller 104 enables the LDO voltage regulators of the power delivery subsystem 108 by asserting a signal LDO_EN (not shown), which triggers the AVBFS controller 106 to control the power delivery subsystem 108 to set the LDO voltage regulators into a default configuration or state. After setting the LDO voltage regulators and confirming they are operating within acceptable ranges, AVBFS controller 106 asserts a POWER_OK signal (not shown), in response to which the system controller 104 resets the AVBFS controller 106 a second time by asserting the RESET signal 214 again with the LDO voltage regulators now providing stable outputs. For this second reset, the AVBFS controller 106 again enters into the default configuration for the control loop FSM 202 and for the voltages VDD and VBB supplied by the power delivery subsystem 108, but with the LDO voltage regulators of the power delivery subsystem 108 operational in their default state. In at least one embodiment, the LDO voltage regulator providing the voltage VDD sets VDD at its lowest level in this default state so as to allow for a monotonic VDD search using the techniques described below while reducing or minimizing the energy spent on charging the intrinsic capacitance of the electronic device 100. At this point, the AVBFS controller 106 is ready to begin further configuration.

Following the initialization process of block 304 as described above, at block 306 the system controller 104 triggers the AVBFS controller 106 to determine the process parameter 126 for the digital core 110 by dasserting the RESET signal 214 and asserting the process update enable signal 213 (that is, RESET=0 and UPD_P=1). In response, the AVBFS controller 106 performs a process to determine the process parameter 126 of the digital core 110 using the ring oscillator 208. As noted above, the process parameter 126 is a multiple-bit value that represents the particular process node (i.e., process corner) in which the instance of the digital core 110 operates. An example technique for determining the process parameter 126 using the ring oscillator 208 is described subsequently with reference to FIG. 4.

In response to determining the process parameter 126, at block 308 the system controller 104 triggers the AVBFS controller 106 to determine the current temperature parameter 124 for the digital core 110. Thus, the system controller 104 and asserts the control signal UPD_T 212 (that is, UPT_T=1). In response to detecting the assertion of the control signal UPD_T, the AVBFS controller 106 performs a process to determine the current temperature parameter 124 for the digital parameter using the process parameter 126 determined at block 306. An example technique for determining the temperature parameter 124 using the process parameters 126 and the ring oscillator 208 is described subsequently with reference to FIG. 5.

With the process parameter 126 and current temperature parameter 124 determined, the AVBFS controller 106 is ready to utilize the coarse-grain tuning stage 230 to concurrently determine a coarse-grain level for the supply voltage VDD at block 310 and determine a coarse-grain level for the supply voltage VBB at block 312 using the process parameter 126 and the current temperature parameter 124. To initiate the processes of blocks 310 and 312, the system controller 104 accesses the register or other storage element storing the value representing the particular frequency FREQ to be implemented by the clock subsystem 102 for the clock signal CLK_CORE and provides this value to the AVBFS controller 106. In response, the AVBFS controller 106 determines a coarse-grain voltage level for each of the supply voltage VDD and body-biasing voltage VBB. An example technique for concurrent determination of the coarse-grain levels for the voltages VDD and VBB for a given process parameter 126 and a given temperature parameter 124 is described below with reference to FIG. 6.

At block 314 the AVBFS controller 106 configures the VDD control signal 224 to reflect the determined coarse-grain level for the supply voltage VDD, in response to which the LDO voltage regulator of the power delivery subsystem 108 operates to provide the voltage level specified by this coarse-grain value as the supply voltage VDD. Concurrently, at block 316 the AVBFS controller 106 configures the VBB control signal 226 to reflect the determined coarse-grain level for the body-biasing voltage VBB, in response to which the LDO voltage regulator of the power delivery subsystem 108 operates to provide the voltage level specified by this coarse-grain value as the body-biasing voltage VBB. To illustrate, in one embodiment the VDD control signal 224 and the VBB control signal 226 each constitutes a six bit value (that is, VDD_SET[5:0] and VBB_SET[5:0]) with the most significant four bits (VDD_SET[5:2], VBB_SET[5:2]) used for coarse-grained tuning (and thus providing 64 coarse-grained tuning steps) and the remaining two least significant bits (VDD_SET[1:0, VBB_SET[1:0]) used for fine-grained tuning (and thus providing 4 fine-grained tuning substeps for each coarse-grained step). Accordingly, the coarse-grain value for VDD determined at block 310 would be a four-bit value stored to VDD[5:2] and the remaining two bits VDD[1:0] set to 1 at the coarse-grain tuning stage. Similarly, the coarse-grain value for VBB determined at block 312 would be a four-bit value stored to VBB[5:2] and the remaining two bits VBB[1:0] set to 1 at the coarse-grain tuning stage.

After the power delivery subsystem 108 has been configured to provide the coarse-grain voltage levels for VDD and VBB and sufficient settling time has passed, at block 318, the fine-tuning stage 232 of the AVBFS controller 106 performs fine-grain tuning of the voltage VDD to remove excess margin. In at least one embodiment, the fine-tuning stage 232 uses an iterative tuning approach where the voltage level being fine-tuned is reduced by successive substeps within the implemented coarse-grain step for the voltage level until the CPR monitor 204 determines that the CPR 206 no longer reliably operates at the adjusted voltage level for the specified frequency FREQ. An example of such iterative fine-grain tuning technique is described below with reference to FIG. 7. In some embodiments, at block 320 this same process is performed in parallel to fine-grain tune the voltage level for VBB.

When the fine-grained tuning process of blocks 318, 320 completed, the electronic device 100 operates the digital core 110 using the tuned voltages VDD, VBB provided by the power delivery subsystem 108. However, it will be appreciated that the temperature of the digital core 110 may change during operation for any of a variety of reasons, which in turn may affect the reliability of operation of the circuitry of the digital core 110 with the supplied voltage levels. Accordingly, the system controller 104 may assert the control signal UPD_T (212) on a periodic or aperiodic basis. To illustrate, in some embodiments, the system controller 104 (or the AVBFS controller 106) may implement a count-down timer to periodically trigger an update to the temperature parameter 124. In other embodiments, software executing at the electronic device 100 may issue an interrupt in response to a trigger, and the system controller 104 asserts the UPD_T signal in response to the interrupt. The assertion of the UPD_T signal then triggers the AVBFS controller 106 to determine an updated temperature parameter 124 (block 308) and then coarse-grain tune and fine-grain tune updated voltage levels for VDD and VBB (blocks 310-320) using the updated temperature parameter 124.

Similarly, the frequency FREQ of the clock CLK_CORE supplied to the digital core 110 may be changed after the initial voltage levels are set for VDD and VBB. To illustrate, in some embodiments, the frequency FREQ may be adjusted up or down according to a change in the overall power state or power mode of the electronic device 100. In other embodiments, software executing at the electronic device 100 or a load scheduler implemented at the SOC 112 may identify an upcoming change in the workload of the electronic device 100 and change the frequency FREQ accordingly to reflect the change in workload. An update to the register or other storage element that stores the value representing the frequency FREQ thus triggers the AVBFS controller 106 to determine updated levels for the voltages VDD, VBB through another iteration of the processes of blocks 310-320 using the updated value for the frequency FREQ.

As method 300 demonstrates, the AVBFS controller 106 performs voltage tuning for both the supply voltage VDD and the body-biasing voltage VBB concurrently and, for at least VDD, in two stages. The first stage uses the determined process parameter 126 and the temperature parameter 124 to coarse levels for each of VDD and VBB that are close to the optimum levels, but may have excess margin. The second stage uses iterative tuning though a relatively small set of sublevels or substeps of the respective coarse level, and thus allowing the AVBFS controller 106 to tune to a more optimal final voltage level relatively quickly compared to a single stage iterative approach that tunes over a much larger number of candidate voltage steps.

Figure 4:
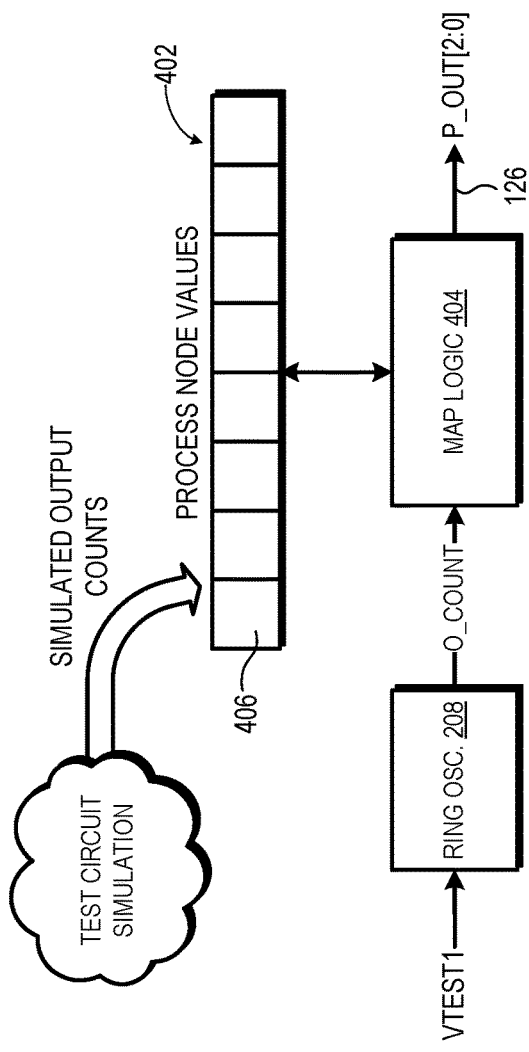
FIG. 4 is a diagram illustrating a technique for process parameter detection employed by the AVBFS controller of FIG. 2 in accordance with some embodiments.

Turning now to FIG. 4, an example configuration and process employed by the AVBFS controller 106 to determine the process parameter 126 per block 306 of method 300 in accordance with some embodiments. In this depicted technique, the AVBFS controller 106 utilizes a process node array 402 and map logic 404, along with the ring oscillator 208, to determine a value representing the process parameter 126. This value is referred to herein as value P_OUT. The process node array 402 includes K entries 406 (K being an integer greater than 1), with each entry 406 having an index associated with a corresponding process node of K process nodes. During the design stage for the electronic device 100, the operation of the design of the ring oscillator 208 is simulated at a test voltage level for the supply voltage VDD, designated "VTEST1", and the simulated readings of the ring oscillator design for each of the K process nodes from the slowest process corner to the fastest process corner is identified and stored to the entry 406 associated with that process node. The voltage level for VTEST1 typically is selected to be a voltage level where the temperature spread of the fabrication process is minimal, such as around the temperature inversion point, which is a voltage of 1.1 volts (V) for a typical FDSOI fabrication process. At this voltage point, the delay of the ring oscillator 208, and thus its output count, for a given VDD and VBB is primarily a result of the particular process node of the ring oscillator 208. The values stored in each entry 406 may be hard coded into the design, programmed during the test/verification process via fuses or other such programmable elements, or stored to a read only memory (ROM) and loaded into the process node array 402 during device initialization. In the illustrated embodiment, the process spread is divided into eight process nodes or steps (from slow corner to fast corner), and thus the process node array 402 has eight entries 406 indexed by a three-bit value (from 000b to 111b).

With the process node array 402 so configured with simulated ring oscillator values for the different process nodes, during the run-time operation of determining the process parameter 126 as represented by block 306 of method 300 of FIG. 3, the power delivery subsystem 108 is configured to supply the actual ring oscillator 208 of the electronic device 100 with the voltage level VTEST1 and the map logic 404 receives the output count (denoted "O_COUNT") of the actual ring oscillator 208 when powered with this voltage VTEST1. The map logic 404 then compares the O_COUNT value with the simulated count values stored in the entries 406 of the process node array 402 to identify which simulated count value is most closely represented by the O_COUNT value using, for example, minimum-error criteria. The index of the entry 406 associated with the simulated count value identified as best batching the O_COUNT value is then output as the value P_OUT with I bits (where I represents the number of bit needed to represent K−1), which represents the particular process node identified as best representing the process parameters of the digital core 110. As there are eight process nodes and thus eight entries 406 in the illustrated example, the value of P_OUT would be a three bit value (POUT[2:0]) representing a particular one of the eight process nodes.

Figure 5:
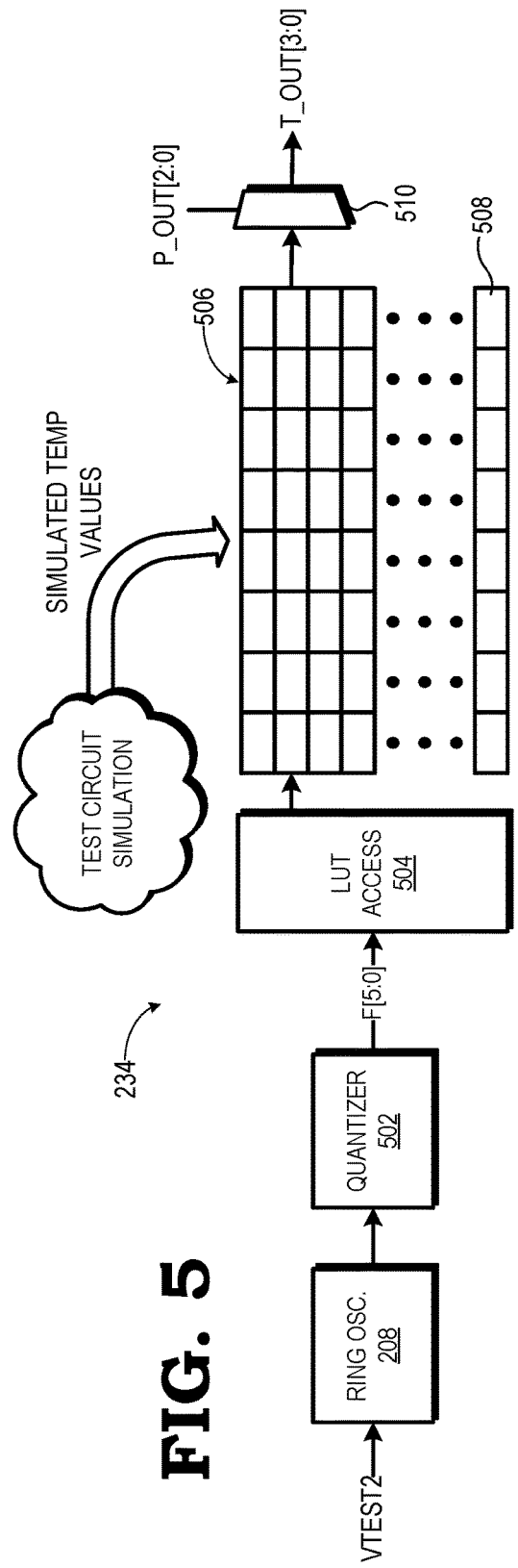
FIG. 5 is a diagram illustrating a technique for temperature parameter detection employed by the AVBFS controller of FIG. 2 in accordance with some embodiments.

FIG. 5 illustrates an example configuration and process employed by the AVBFS controller 106 to determine the temperature parameter 124 per block 308 of method 300 in accordance with some embodiments. In this depicted technique, the AVBFS controller 106 utilizes the temperature LUT 234 along with the ring oscillator 208, to determine a value representing the temperature parameter 124. This value is referred to herein as value T_OUT. In one embodiment, the temperature LUT 234 includes a quantizer 502, LUT access logic 504, a temperature map 506, and a demultiplexer 510. The temperature map 506 includes N rows of K entries 508 each, where N is an integer greater than 1 and K represents the number of process nodes in the process spread as represented in the process node array 402 of the configuration of FIG. 4.

During the design stage for the electronic device 100, the operation of the ring oscillator design is again simulated at a test voltage level for the supply voltage VDD, designated "VTEST2", for each of the K process nodes and for N different temperature values or ranges. The output count of the simulation of the ring oscillator design for a given process node/temperature range pair is J-bit quantized (where J is the number of bits required to represent a value of N−1) and an M-bit value representing the associated temperature value is stored at the entry 508 of the temperature map 506 row indexed by the J-bit quantized output count and column indexed by the I-bit P_OUT value for the corresponding process node. The voltage level for VTEST2 typically is selected to be a voltage level below the voltage at the temperature inversion point used for VTEST1, such as at a voltage of 0.7 volts (V) for a typical FDSOI fabrication process. At this voltage point, the delay of the ring oscillator 208, and thus its output count, for a given VDD and VBB is primarily a result of the temperature of the ring oscillator 208. The values stored in each entry 508 may be hard coded into the design, programmed during the test/verification process via fuses or other such programmable elements, or stored to ROM and loaded into the temperature map 506 during device initialization. As per the illustrated embodiment of FIG. 4 and in the illustrated embodiment of FIG. 5, the process spread into eight process nodes or steps (K=8, I=3) and the oscillator count of the ring oscillator 208 is 6-bit quantized (J=6, N=64), and thus the temperature map 506 has 64 rows of eight entries 508 each, and each entry 508 stores a corresponding 3-bit temperature value. As such, each row of eight three-bit temperature values can be represented as a 32-bit word.

With the temperature map 506 configured with simulated temperature values for different process nodes/quantized output count pairs, during the run-time operation of determining the temperature parameter 124 as represented by block 308 of method 300 of FIG. 3, the power delivery subsystem 108 is configured to supply the actual ring oscillator 208 of the electronic device 100 with the voltage level VTEST2 and the quantizer 502 receives the output count of the actual ring oscillator 208 when powered with this voltage VTEST2. The quantizer 502 quantizes the output count of the ring oscillator 208 into a J-bit value (denoted "F[J−1:0]") and the LUT access logic 504 uses this quantized value to index a corresponding row of the temperature map 506. Each temperature value at an entry 508 in the indexed row is input to the demultiplexer 510, which selects the temperature value at the entry 508 at the row that is indexed by the value P_OUT representing the process parameter 126 determined previously at block 306, and this selected temperature value is output as the value T_OUT representing the temperature parameter 124. As such, the quantized oscillator count serves to identify the various temperature values associated with the simulated ring oscillator at the different process nodes, and then the process parameter value P_OUT is used to select the temperature value at the particular process node detected previously.

As FIGS. 4 and 5 together illustrate, for a given VDD and VBB, the delay of a ring oscillator is substantially a function of process when the voltage VDD is near the temperature inversion point and is substantially a function of temperature when the voltage VDD is lower than this temperature inversion point, and this property can be exploited so that the AVBFS controller 106 can use the ring oscillator 208 to first determine the process parameter 126 of the digital core 110, and then use this same ring oscillator 208 to determine the current temperature parameter 124 of the digital core 110 based on the determined process parameter 126. As such, the AVBFS controller 106 can, in effect, employ a single sensor (that is, the ring oscillator 208) to detect both process and temperature.

Figure 6:
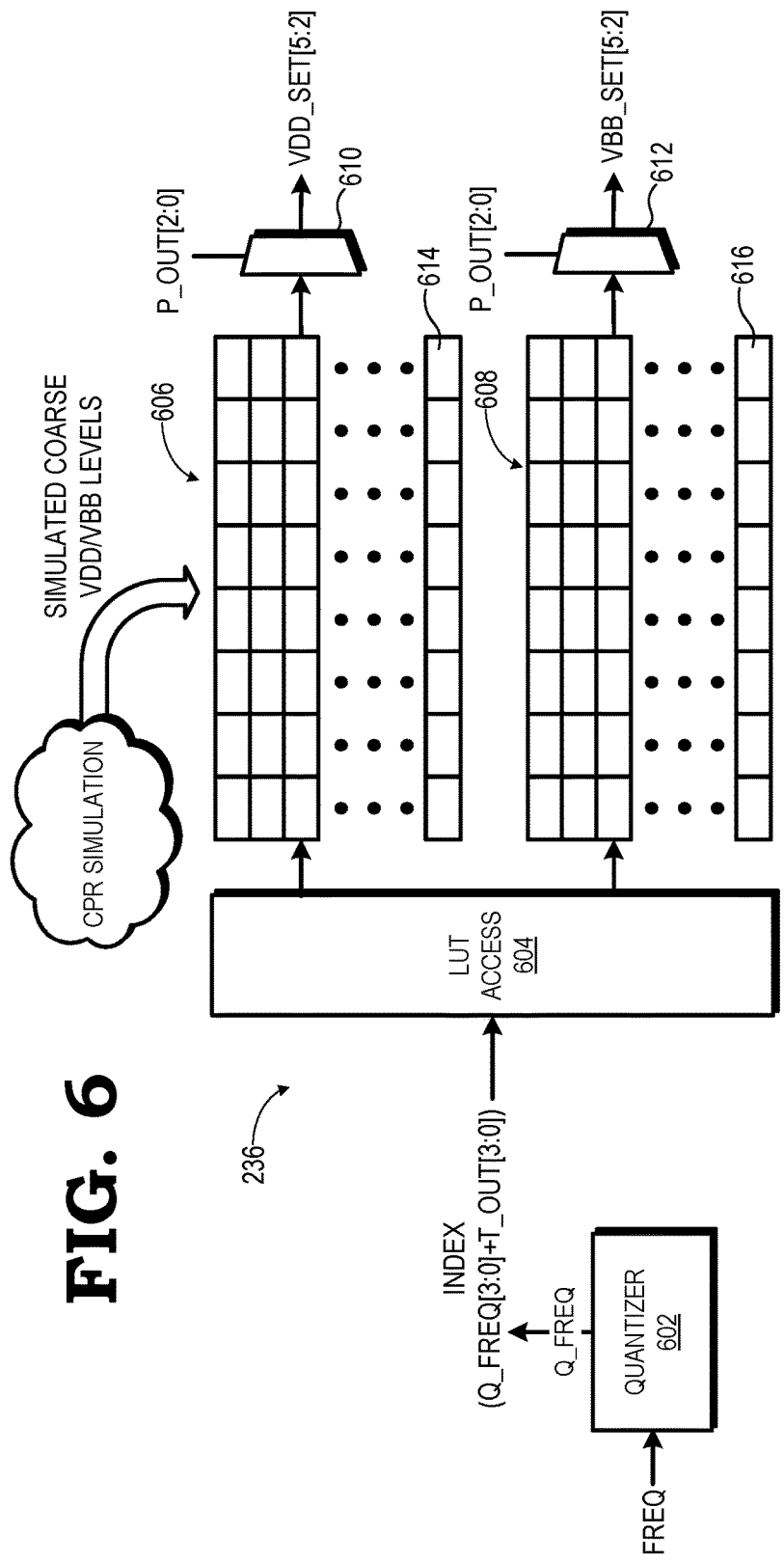
FIG. 6 is a diagram illustrating a technique for coarse-tuning a voltage level employed by the AVBFS controller of FIG. 2 in accordance with some embodiments.

FIG. 6 illustrates an example configuration and process employed by the AVBFS controller 106 to concurrently determine the coarse-grain values for the voltages VDD and VBB per blocks 310 and 312 of method 300 in accordance with some embodiments. In this depicted technique, the AVBFS controller 106 utilizes the joint VDD/VBB LUT 236, the current value T_OUT of the temperature parameter 124, the value P_OUT of the process parameters P_OUT and a representation of the current frequency FREQ to determine a coarse-grain value for VDD_SET and a coarse-grain value for VBB_SET concurrently. In the depicted embodiment, the joint VDD/VBB LUT 236 includes a quantizer 602, LUT access logic 604, a coarse VDD map 606, a coarse VBB map 608, and demultiplexers 610 and 612. The coarse VDD map 606 includes L rows of K entries 614 per row and the coarse VBB map 608 likewise includes L rows of K entries 616 per row, where L is an integer greater than 1 and K represents the number of process nodes in the process spread as represented in the process node array 402 of the configuration of FIG. 4.

During the design stage for the electronic device 100, the operation of the CPR 206 is simulated at the K different process corners, N different temperature values, and a multitude of levels for both voltage VDD and voltage VBB, and the resulting R-bit quantized representation of the output frequency of the simulated CPR 206 and the M-bit temperature value for a given test point are combined to index an entry 614 in the coarse VDD map 606 and index an entry 616 in the coarse VBB map 608, and an S-bit value representing the value of VDD at that test point is stored at the indexed entry 614 and an S-bit value representing the value of VBB at the test point is stored at the indexed entry 616. As such, each row of the coarse VDD map 606 corresponds to a particular combination of frequency FREQ (in quantized form) and temperature and the various voltages for VDD observed for different process nodes in the simulation for that frequency/temperature combination. Likewise, each row of the coarse VBB map 608 corresponds to a particular combination of frequency FREQ (in quantized form) and temperature and the various voltages for VBB observed for different process nodes in the simulation for that frequency/temperature combination.

During run-time operation, to determine the coarse value for VDD_SET (block 310 of method 300) and the coarse value for VBB_SET (block 312 of method 300), the quantizer 602 converts the current value for FREQ to an R-bit quantized value Q_FREQ[R−1:0] and the LUT access logic 604 combines this value with the value T_OUT[M−1:0] determined for the temperature parameter 124 at block 308 of method 300 to generate a value INDEX having R+M bits, that is, INDEX[R+M−1:0]=Q_FREQ[R−1:0]+T_OUT[M−1:0]. Each coarse VDD value at an entry 614 at the row of the coarse VDD map 606 indexed by the value INDEX is input to the demultiplexer 610, which selects the coarse VDD value at the entry 614 indexed by the value P_OUT representing the process parameter 126 determined previous at block 306, and this selected coarse VDD value is output as the coarse component of VDD_SET. Similarly, each coarse VBB value at an entry 616 at the row of the coarse VBB map 608 indexed by the value INDEX is input to the demultiplexer 612, which selects the coarse VBB value at the entry 616 indexed by the value P_OUT, and this selected coarse VBB value is output as the coarse component of VBB_SET.

To illustrate an example configuration, in one embodiment the quantizer 602 generates a four-bit quantized representation of the frequency FREQ, the temperature value T_OUT is four bits, and the process value P_OUT is three bits (that is, R=6, M=3, and 1=3), which results in the maps 606, 608 having 8 ($2^3$) columns and 256 ($2^{4+4}$) rows each. Further, each coarse VDD value and coarse VBB value stored in the entries 614, 616, respectively, has four bits (and thus setting the values for VDD_SET[5:2] and VBB_SET [52:1] assuming two-bit fine VDD_SET and VBB set values).

Figure 7:
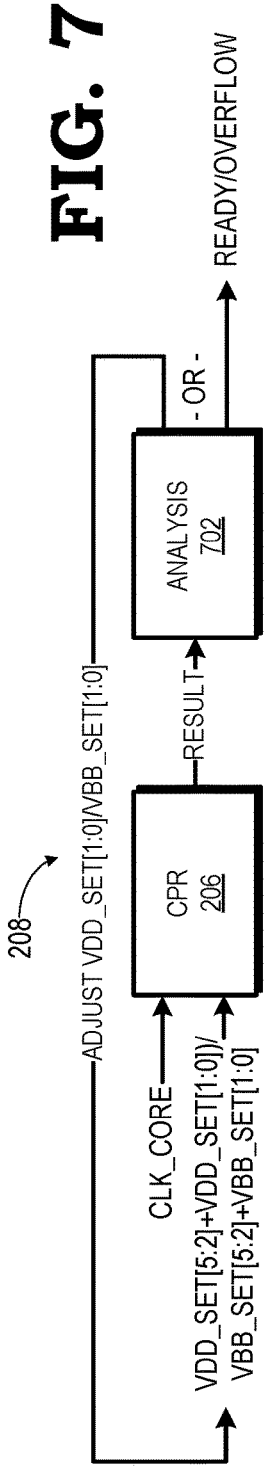
FIG. 7 is a diagram illustrating a technique for fine-tuning a coarse-tuned voltage as employed by the AVBFS controller of FIG. 2 in accordance with some embodiments.

FIG. 7 illustrates an example configuration and process employed by the AVBFS controller 106 for the fine-grain tuning of VDD and VBB at blocks 318 and 320 of method 300 in accordance with some embodiments. In this depicted technique, the CPR monitor 204 utilizes the CPR 206 and analysis logic 702 to iteratively adjust the fine-grain component of one or both of the voltages VDD and VBB to identify well-suited values for one or both of VDD and VBB. Accordingly, during the fine-tuning stage 232, the clock signal 120 (CLK_CORE) having the specified frequency FREQ is supplied to the CPR 206 and the CPR 206 is powered by the voltages VDD and VBB provided by the power delivery subsystem 108 in accordance with the values VDD_SET and VBB_SET, respectively, initially configured with the coarse VDD value and coarse VBB value, respectively, determined at blocks 310, 312 using, for example, the technique of FIG. 6. The analysis logic 702 then analyzes the operation of the CPR 206 to determine whether the CPR 206 is adequately operational under the input voltage conditions at the frequency FREQ. If so, the analysis logic 702 initiates a next iteration of this process by adjusting one or both of the voltages VDD and VBB supplied to the CPR 206 by adjusting the fine-grain component of one or both of VDD_SET and VBB_SET, and analyzing the results of the operation of the CPR 206 under these revised voltage conditions. This iterative process continues until the CPR 206 fails to operate in accordance with specified parameters, and the analysis logic 702 thus identifies the value of VDD_SET and VBB_SET prior to the iteration that resulted in operational failure as the settings for VDD and VBB to be employed by the power delivery subsystem 108 for operation of the digital core 110 by asserting a READY signal. In the even that analysis logic 702 cycles through each fine-grain level and is unable to identify a voltage level that enables sufficient operation of the CPR 206, the analysis logic 702 asserts an OVERFLOW signal to signal to the system controller 104 that the voltage tuning process was unable to find an adequate voltage level under the current conditions.

As illustrated by the processes of FIGS. 6 and 7, the sequence of coarse-grain tuning of the voltages VDD and VBB through LUTs that are efficiently indexed based on a combination of frequency FREQ, temperature parameter 124, and process parameter 126 results in rapid identification and deployment of a coarse level for these voltages. The subsequent fine-grain tuning stage thus is required to tune over a smaller range (e.g., four substeps for a configuration represented by a six-bit voltage value with 16 coarse voltage steps), which results in faster fine-grain tuning due to both the smaller average number of iterations and the reduced settling time required for the smaller voltage jumps between fine-tuning iterations.

A method for voltage tuning at an electronic device includes determining a process parameter for the electronic device, determining a current temperature parameter for the electronic device, and concurrently determining a first coarse-grain level for a supply voltage to be provided to a digital circuit of the electronic device and a second coarse-grain level for a body-biasing voltage to be provided to the digital circuit based on the process parameter, the current temperature parameter, and a frequency of a clock signal to be supplied to the digital circuit. The method further includes determining a fine-grain level for the supply voltage, providing the supply voltage based on the first coarse-grain level and the fine-grain level to the digital circuit, and providing the body-biasing voltage based on the second coarse-grain level to the digital circuit.

In one embodiment, determining the process parameter includes providing a process node array having a plurality of entries, each entry storing a simulated count value from a simulation of a ring oscillator design at a corresponding process node of a plurality of process nodes, providing a first test supply voltage to a ring oscillator of the electronic device, the ring oscillator having the ring oscillator design, and comparing an output count of the ring oscillator to the plurality of entries of the process node array to identify an entry storing a simulated count value that most closely matches the output count of the ring oscillator, and configuring the process parameter as an index of the identified entry. In some embodiments, determining the current temperature parameter includes providing a temperature look-up table (LUT) having a plurality of entries arranged in a plurality of rows and a plurality of columns, each column corresponding to a processing node of the plurality of processing nodes and each row corresponding to a quantized output count of the ring oscillator, wherein each entry stores a corresponding temperature value representing a simulated temperature of a simulation of the ring oscillator design for a corresponding process node of the plurality of process nodes and for a given simulated count value of the ring oscillator design, providing a second test supply voltage to the ring oscillator of the electronic device, indexing a row of the temperature LUT based on a quantized output of the ring oscillator, selecting an entry of the row based on the process parameter, and configuring the current temperature parameter as the temperature value stored at the selected entry. In some embodiments, the method further includes setting the first test supply voltage based on a voltage at a temperature inversion point of transistors of the digital circuit, and setting the second test supply voltage at a voltage lower than the first test supply voltage.

In at least one embodiment, concurrently determining the first coarse-grain level for the supply voltage and the second coarse-grain level for the body-biasing voltage includes: providing a voltage LUT having a first map and a second map, the first map comprising a plurality of first entries arranged in a plurality of rows and a plurality of columns and the second map comprising a plurality of second entries arranged in a plurality of rows and a plurality of columns, wherein each column of the first map and the second map is associated with a corresponding processing node of the plurality of processing nodes and each row of the first map and the second map is associated with a combination of a corresponding temperature value and a corresponding quantized frequency value, wherein each first entry stores a corresponding coarse supply voltage value and each second entry stores a corresponding coarse body-biasing voltage value; quantizing a value representing the frequency of the clock signal to determine a quantized value; selecting a row of the first map and a row of the second map based on the quantized value and the current temperature parameter; selecting a first entry of the selected row of the first map and a second entry of the selected row of the second map based on the process parameter; configuring the first coarse-grain level based on the coarse supply voltage value stored at the selected first entry of the selected row of the first map; and configuring the second coarse-grain level based on the coarse supply voltage value stored at the selected second entry of the selected row of the second map. In one embodiment, determining the fine-grain level for the supply voltage includes providing a test voltage to a replica circuit that replicates a critical path of the digital circuit, the test voltage based on the first coarse-grain level and a test fine-grain level; analyzing an operation of the replica circuit being provided the test voltage; and iteratively adjusting the test fine-grain level and analyzing the operation of the replica circuit using an adjusted test voltage that is based on the first coarse-grain level and the adjusted test fine-grain level; and setting the fine-grain level to the test fine-grain level of an iteration identified as having a test voltage that provides reduced voltage margin while the replica circuit remains functionally operational at that test voltage.

In one embodiment, the digital circuit comprises transistors fabricated using a fully-depleted silicon-on-insulator (FDSOI) process. In one embodiment, determining the current temperature parameter includes: providing a temperature look-up table (LUT) having a plurality of entries arranged in a plurality of rows and a plurality of columns, each column corresponding to a processing node of a plurality of processing nodes and each row corresponding to a quantized output count of a ring oscillator, wherein each entry stores a corresponding temperature value representing a simulated temperature of a simulation of a ring oscillator design for a corresponding process node of the plurality of process nodes and for a given simulated count value of the ring oscillator design; providing a second test supply voltage to the ring oscillator; indexing a row of the temperature LUT based on a quantized output of the ring oscillator; selecting an entry of the row based on the process parameter; and configuring the current temperature parameter as the temperature value stored at the selected entry.

In one embodiment, concurrently determining the first coarse-grain level for the supply voltage and the second coarse-grain level for the body-biasing voltage includes: providing a voltage look-up table (LUT) having a first map and a second map, the first map comprising a plurality of first entries arranged in a plurality of rows and a plurality of columns and the second map comprising a plurality of second entries arranged in a plurality of rows and a plurality of columns, wherein each column of the first map and the second map is associated with a corresponding processing node of a plurality of processing nodes and each row of the first map and the second map is associated with a combination of a corresponding temperature value and a corresponding quantized frequency value, wherein each first entry stores a corresponding coarse supply voltage value and each second entry stores a corresponding coarse body-biasing voltage value; quantizing a value representing the frequency of the clock signal to determine a quantized value; selecting a row of the first map and a row of the second map based on the quantized value and the current temperature parameter; selecting an entry of the selected row of the first map and an entry of the selected row of the second map based on the process parameter; configuring the first coarse-grain level based on the coarse supply voltage value stored at the selected entry of the selected row of the first map; and configuring the second coarse-grain level based on the coarse supply voltage value stored at the selected entry of the selected row of the second map.

In at least one embodiment, an electronic device includes a digital circuit; a power delivery subsystem configured to provide a supply voltage and a body-biasing voltage to the digital circuit; and a controller coupled to the power delivery subsystem, the controller configured to determine a process parameter for the electronic device, determine a current temperature parameter for the electronic device, concurrently determine a first coarse-grain level for the supply voltage and a second coarse-grain level for the body-biasing voltage based on the process parameter, the current temperature parameter, and a frequency of a clock signal to be supplied to the digital circuit, and to determine a fine-grain level for the supply voltage. In one embodiment, the controller includes: a process node array having a plurality of entries, each entry storing a simulated count value from a simulation of a ring oscillator design at a corresponding process node of a plurality of process nodes; and a ring oscillator having the ring oscillator design. The controller is configured to determine the process parameter by: providing a first test supply voltage to the ring oscillator; comparing an output count of the ring oscillator to the plurality of entries of the process node array to identify an entry storing a simulated count value that most closely matches the output count of the ring oscillator; and configuring the process parameter as an index of the identified entry.

In one embodiment, the controller further includes: a temperature look-up table (LUT) having a plurality of entries arranged in a plurality of rows and a plurality of columns, each column corresponding to a processing node of the plurality of processing nodes and each row corresponding to a quantized output count of the ring oscillator, wherein each entry stores a corresponding temperature value representing a simulated temperature of a simulation of the ring oscillator design for a corresponding process node of the plurality of process nodes and for a given simulated count value of the ring oscillator design. The controller is configured to determine the current temperature parameter by: providing a second test supply voltage to the ring oscillator of the electronic device; indexing a row of the temperature LUT based on a quantized output of the ring oscillator; selecting an entry of the row based on the process parameter; and configuring the current temperature parameter as the temperature value stored at the selected entry. In one embodiment, the controller further includes a voltage LUT having a first map and a second map, the first map comprising a plurality of first entries arranged in a plurality of rows and a plurality of columns and the second map comprising a plurality of second entries arranged in a plurality of rows and a plurality of columns, wherein each column of the first map and the second map is associated with a corresponding processing node of the plurality of processing nodes and each row of the first map and the second map is associated with a combination of a corresponding temperature value and a corresponding quantized frequency value, wherein each first entry stores a corresponding coarse supply voltage value and each second entry stores a corresponding coarse body-biasing voltage value; and a quantizer to quantize a value representing the frequency of the clock signal to determine a quantized value. The controller is configured to concurrently determine the first coarse-grain level for the supply voltage and the second coarse-grain level for the body-biasing voltage by: selecting a row of the first map and a row of the second map based on the quantized value and the current temperature parameter; selecting a first entry of the selected row of the first map and a second entry of the selected row of the second map based on the process parameter; configuring the first coarse-grain level based on the coarse supply voltage value stored at the selected first entry of the selected row of the first map; and configuring the second coarse-grain level based on the coarse supply voltage value stored at the selected second entry of the selected row of the second map.

In accordance with another embodiment, a method includes providing a supply voltage and a body-biasing voltage to a digital circuit of an electronic device; determining a process parameter of the digital circuit based on an operation of a ring oscillator of the electronic device at a first voltage level of the supply voltage; determining a current temperature parameter of the digital circuit based on an operation of the ring oscillator at a second voltage level of the supply voltage, the second voltage level lower than the first voltage level; and configuring a level for the supply voltage and a level for the body-biasing voltage based on the process parameter, the current temperature parameter, and a frequency of a clock signal provided to the digital circuit. In one embodiment, determining the process parameter includes: populating each entry of a processing node array with a value representing a simulated output count of a simulation of a design of the ring oscillator at a corresponding process node of a plurality of processing node; determining an actual output count of the ring oscillator when supplied with a voltage having the first voltage level; and configuring an index of the entry storing a simulated output count that most closely matches the actual output count as the process parameter.

In one embodiment, determining the current temperature parameter includes: populating each entry of a temperature map with a temperature value determined from a simulation of a design of the ring oscillator at different process nodes of a plurality of processing nodes; determining an actual output count of the ring oscillator when supplied with a voltage having the second voltage level; selecting a row of the temperature map based on the actual output count; and configuring the temperature value stored at the entry of the row that is associated with the process parameter as the current temperature parameter.

In one embodiment, configuring a level for the supply voltage includes: populating each entry of a supply voltage map with a voltage value determined from a simulation of a design of a critical path replica circuit at different process nodes of a plurality of processing nodes, at different temperature levels, and at different supply voltage levels; selecting a row of the supply voltage map based on the frequency of the clock signal and based on the current temperature parameter; selecting an entry of the row based on the process parameter; and configuring the level for the supply voltage based on the voltage value stored at the selected entry of the selected row.

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method for voltage tuning at an electronic device, the method comprising:
   determining a process parameter for the electronic device;
   determining a current temperature parameter for the electronic device;
   concurrently determining a first coarse-grain level for a supply voltage to be provided to a digital circuit of the electronic device and a second coarse-grain level for a body-biasing voltage to be provided to the digital circuit based on the process parameter, the current temperature parameter, and a frequency of a clock signal to be supplied to the digital circuit;
   determining a fine-grain level for the supply voltage;
   providing the supply voltage based on the first coarse-grain level and the fine-grain level to the digital circuit;
   providing the body-biasing voltage based on the second coarse-grain level to the digital circuit,
   wherein determining the process parameter comprises:
      providing a process node array having a plurality of entries, each entry storing a simulated count value from a simulation of a ring oscillator design at a corresponding process node of a plurality of process nodes;
      providing a first test supply voltage to a ring oscillator of the electronic device, the ring oscillator having the ring oscillator design;
      comparing an output count of the ring oscillator to the plurality of entries of the process node array to identify an entry storing a simulated count value that most closely matches the output count of the ring oscillator; and
      configuring the process parameter as an index of the identified entry.

2. The method of claim 1, wherein determining the current temperature parameter comprises:
   providing a temperature look-up table (LUT) having a plurality of entries arranged in a plurality of rows and a plurality of columns, each column corresponding to a processing node of the plurality of processing nodes and each row corresponding to a quantized output count of the ring oscillator, wherein each entry stores a corresponding temperature value representing a simulated temperature of a simulation of the ring oscillator design for a corresponding process node of the plurality of process nodes and for a given simulated count value of the ring oscillator design;
   providing a second test supply voltage to the ring oscillator of the electronic device;
   indexing a row of the temperature LUT based on a quantized output of the ring oscillator;
   selecting an entry of the row based on the process parameter; and
   configuring the current temperature parameter as the temperature value stored at the selected entry.

3. The method of claim 2, further comprising:
setting the first test supply voltage based on a voltage at a temperature inversion point of transistors of the digital circuit; and
setting the second test supply voltage at a voltage lower than the first test supply voltage.

4. The method of claim 2, wherein concurrently determining the first coarse-grain level for the supply voltage and the second coarse-grain level for the body-biasing voltage comprises:
providing a voltage LUT having a first map and a second map, the first map comprising a plurality of first entries arranged in a plurality of rows and a plurality of columns and the second map comprising a plurality of second entries arranged in a plurality of rows and a plurality of columns, wherein each column of the first map and the second map is associated with a corresponding processing node of the plurality of processing nodes and each row of the first map and the second map is associated with a combination of a corresponding temperature value and a corresponding quantized frequency value, wherein each first entry stores a corresponding coarse supply voltage value and each second entry stores a corresponding coarse body-biasing voltage value;
quantizing a value representing the frequency of the clock signal to determine a quantized value;
selecting a row of the first map and a row of the second map based on the quantized value and the current temperature parameter;
selecting a first entry of the selected row of the first map and a second entry of the selected row of the second map based on the process parameter;
configuring the first coarse-grain level based on the coarse supply voltage value stored at the selected first entry of the selected row of the first map; and
configuring the second coarse-grain level based on the coarse supply voltage value stored at the selected second entry of the selected row of the second map.

5. The method of claim 4, wherein determining the fine-grain level for the supply voltage comprises:
providing a test voltage to a replica circuit that replicates a critical path of the digital circuit, the test voltage based on the first coarse-grain level and a test fine-grain level;
analyzing an operation of the replica circuit being provided the test voltage; and
iteratively adjusting the test fine-grain level and analyzing the operation of the replica circuit using an adjusted test voltage that is based on the first coarse-grain level and the adjusted test fine-grain level; and
setting the fine-grain level to the test fine-grain level of an iteration identified as having a test voltage that provides reduced voltage margin while the replica circuit remains functionally operational at that test voltage.

6. The method of claim 1, wherein the digital circuit comprises transistors fabricated using a fully-depleted silicon-on-insulator (FDSOI) process.

7. A method for voltage tuning at an electronic device, the method comprising:
determining a process parameter for the electronic device;
determining a current temperature parameter for the electronic device;
concurrently determining a first coarse-grain level for a supply voltage to be provided to a digital circuit of the electronic device and a second coarse-grain level for a body-biasing voltage to be provided to the digital circuit based on the process parameter, the current temperature parameter, and a frequency of a clock signal to be supplied to the digital circuit;
determining a fine-grain level for the supply voltage;
providing the supply voltage based on the first coarse-grain level and the fine-grain level to the digital circuit;
providing the body-biasing voltage based on the second coarse-grain level to the digital circuit,
wherein determining the current temperature parameter comprises:
providing a temperature look-up table (LUT) having a plurality of entries arranged in a plurality of rows and a plurality of columns, each column corresponding to a processing node of a plurality of processing nodes and each row corresponding to a quantized output count of a ring oscillator, wherein each entry stores a corresponding temperature value representing a simulated temperature of a simulation of a ring oscillator design for a corresponding process node of the plurality of process nodes and for a given simulated count value of the ring oscillator design;
providing a second test supply voltage to the ring oscillator;
indexing a row of the temperature LUT based on a quantized output of the ring oscillator;
selecting an entry of the row based on the process parameter; and
configuring the current temperature parameter as the temperature value stored at the selected entry.

8. A method for voltage tuning at an electronic device, the method comprising:
determining a process parameter for the electronic device;
determining a current temperature parameter for the electronic device;
concurrently determining a first coarse-grain level for a supply voltage to be provided to a digital circuit of the electronic device and a second coarse-grain level for a body-biasing voltage to be provided to the digital circuit based on the process parameter, the current temperature parameter, and a frequency of a clock signal to be supplied to the digital circuit;
determining a fine-grain level for the supply voltage;
providing the supply voltage based on the first coarse-grain level and the fine-grain level to the digital circuit;
providing the body-biasing voltage based on the second coarse-grain level to the digital circuit,
wherein concurrently determining the first coarse-grain level for the supply voltage and the second coarse-grain level for the body-biasing voltage comprises:
providing a voltage look-up table (LUT) having a first map and a second map, the first map comprising a plurality of first entries arranged in a plurality of rows and a plurality of columns and the second map comprising a plurality of second entries arranged in a plurality of rows and a plurality of columns, wherein each column of the first map and the second map is associated with a corresponding processing node of a plurality of processing nodes and each row of the first map and the second map is associated with a combination of a corresponding temperature value and a corresponding quantized frequency value, wherein each first entry stores a corresponding coarse supply voltage value and each second entry stores a corresponding coarse body-biasing voltage value;
quantizing a value representing the frequency of the clock signal to determine a quantized value;

selecting a row of the first map and a row of the second map based on the quantized value and the current temperature parameter;
selecting an entry of the selected row of the first map and an entry of the selected row of the second map based on the process parameter;
configuring the first coarse-grain level based on the coarse supply voltage value stored at the selected entry of the selected row of the first map; and
configuring the second coarse-grain level based on the coarse supply voltage value stored at the selected entry of the selected row of the second map.

9. An electronic device comprising:
a digital circuit;
a power delivery subsystem configured to provide a supply voltage and a body-biasing voltage to the digital circuit; and
a controller coupled to the power delivery subsystem, the controller configured to determine a process parameter for the electronic device, determine a current temperature parameter for the electronic device, concurrently determine a first coarse-grain level for the supply voltage and a second coarse-grain level for the body-biasing voltage based on the process parameter, the current temperature parameter, and a frequency of a clock signal to be supplied to the digital circuit, and to determine a fine-grain level for the supply voltage,
wherein the controller comprises:
a process node array having a plurality of entries, each entry storing a simulated count value from a simulation of a ring oscillator design at a corresponding process node of a plurality of process nodes; and
a ring oscillator having the ring oscillator design; and
wherein the controller is configured to determine the process parameter by:
providing a first test supply voltage to the ring oscillator;
comparing an output count of the ring oscillator to the plurality of entries of the process node array to identify an entry storing a simulated count value that most closely matches the output count of the ring oscillator; and
configuring the process parameter as an index of the identified entry.

10. The electronic device of claim 9, wherein the controller further comprises:
a temperature look-up table (LUT) having a plurality of entries arranged in a plurality of rows and a plurality of columns, each column corresponding to a processing node of the plurality of processing nodes and each row corresponding to a quantized output count of the ring oscillator, wherein each entry stores a corresponding temperature value representing a simulated temperature of a simulation of the ring oscillator design for a corresponding process node of the plurality of process nodes and for a given simulated count value of the ring oscillator design; and
wherein the controller is configured to determine the current temperature parameter by:
providing a second test supply voltage to the ring oscillator of the electronic device;
indexing a row of the temperature LUT based on a quantized output of the ring oscillator;
selecting an entry of the row based on the process parameter; and
configuring the current temperature parameter as the temperature value stored at the selected entry.

11. The electronic device of claim 10, wherein the controller further comprises:
a voltage LUT having a first map and a second map, the first map comprising a plurality of first entries arranged in a plurality of rows and a plurality of columns and the second map comprising a plurality of second entries arranged in a plurality of rows and a plurality of columns, wherein each column of the first map and the second map is associated with a corresponding processing node of the plurality of processing nodes and each row of the first map and the second map is associated with a combination of a corresponding temperature value and a corresponding quantized frequency value, wherein each first entry stores a corresponding coarse supply voltage value and each second entry stores a corresponding coarse body-biasing voltage value; and
a quantizer to quantize a value representing the frequency of the clock signal to determine a quantized value; and
wherein the controller is configured to concurrently determine the first coarse-grain level for the supply voltage and the second coarse-grain level for the body-biasing voltage by:
selecting a row of the first map and a row of the second map based on the quantized value and the current temperature parameter;
selecting a first entry of the selected row of the first map and a second entry of the selected row of the second map based on the process parameter;
configuring the first coarse-grain level based on the coarse supply voltage value stored at the selected first entry of the selected row of the first map; and
configuring the second coarse-grain level based on the coarse supply voltage value stored at the selected second entry of the selected row of the second map.

12. The electronic device of claim 11, wherein the controller further comprises:
a replica circuit that replicates a critical path of the digital circuit; and
wherein the controller is configured to determine the fine-grain level for the supply voltage by:
providing a test voltage to the replica circuit, the test voltage based on the first coarse-grain level and a test fine-grain level;
analyzing an operation of the replica circuit being provided the test voltage; and
iteratively adjusting the test fine-grain level and analyzing the operation of the replica circuit using an adjusted test voltage that is based on the first coarse-grain level and the adjusted test fine-grain level; and
setting the fine-grain level to the test fine-grain level of an iteration identified as having a test voltage that provides reduced voltage margin while the replica circuit remains functionally operational at that test voltage.

13. The electronic device of claim 9, wherein the digital circuit comprises transistors fabricated using a fully-depleted silicon-on-insulator (FDSOI) process.

14. An electronic device, comprising:
a digital circuit;
a power delivery subsystem configured to provide a supply voltage and a body-biasing voltage to the digital circuit; and
a controller coupled to the power delivery subsystem, the controller configured to determine a process parameter for the electronic device, determine a current temperature parameter for the electronic device, concurrently determine a first coarse-grain level for the supply voltage and a second coarse-grain level for the body-biasing voltage based on the process parameter, the current temperature parameter, and a frequency of a clock signal to be supplied to the digital circuit, and to determine a fine-grain level for the supply voltage, wherein the controller comprises:

a voltage LUT having a first map and a second map, the first map comprising a plurality of first entries arranged in a plurality of rows and a plurality of columns and the second map comprising a plurality of second entries arranged in a plurality of rows and a plurality of columns, wherein each column of the first map and the second map is associated with a corresponding processing node of a plurality of processing nodes and each row of the first map and the second map is associated with a combination of a corresponding temperature value and a corresponding quantized frequency value, wherein each first entry stores a corresponding coarse supply voltage value and each second entry stores a corresponding coarse body-biasing voltage value; and a quantizer to quantize a value representing the frequency of the clock signal to determine a quantized value; and wherein the controller is configured to concurrently determine the first coarse-grain level for the supply voltage and the second coarse-grain level for the body-biasing voltage by:

selecting a row of the first map and a row of the second map based on the quantized value and the current temperature parameter;

selecting a first entry of the selected row of the first map and a second entry of the selected row of the second map based on the process parameter;

configuring the first coarse-grain level based on the coarse supply voltage value stored at the selected first entry of the selected row of the first map; and configuring the second coarse-grain level based on the coarse supply voltage value stored at the selected second entry of the selected row of the second map.

15. An electronic device comprising:

a digital circuit;

a power delivery subsystem configured to provide a supply voltage and a body-biasing voltage to the digital circuit; and a controller coupled to the power delivery subsystem, the controller configured to determine a process parameter for the electronic device, determine a current temperature parameter for the electronic device, concurrently determine a first coarse-grain level for the supply voltage and a second coarse-grain level for the body-biasing voltage based on the process parameter, the current temperature parameter, and a frequency of a clock signal to be supplied to the digital circuit, and to determine a fine-grain level for the supply voltage, wherein the controller comprises:

a replica circuit that replicates a critical path of the digital circuit; and wherein the controller is configured to determine the fine-grain level for the supply voltage by:

providing a test voltage to the replica circuit, the test voltage based on the first coarse-grain level and a test fine-grain level;

analyzing an operation of the replica circuit being provided the test voltage; and iteratively adjusting the test fine-grain level and analyzing the operation of the replica circuit using an adjusted test voltage that is based on the first coarse-grain level and the adjusted test fine-grain level; and setting the fine-grain level to the test fine-grain level of an iteration identified as having a test voltage that provides reduced voltage margin while the replica circuit remains functionally operational at that test voltage.

16. A method comprising:

providing a supply voltage and a body-biasing voltage to a digital circuit of an electronic device;

determining a process parameter of the digital circuit based on an operation of a ring oscillator of the electronic device at a first voltage level of the supply voltage;

determining a current temperature parameter of the digital circuit based on an operation of the ring oscillator at a second voltage level of the supply voltage, the second voltage level lower than the first voltage level; and configuring a level for the supply voltage and a level for the body-biasing voltage based on the process parameter, the current temperature parameter, and a frequency of a clock signal provided to the digital circuit, wherein determining the process parameter comprises:

populating each entry of a plurality of entries of a processing node array with a value representing a simulated output count of a simulation of a design of the ring oscillator at a corresponding process node of a plurality of processing node;

determining an actual output count of the ring oscillator when supplied with a voltage having the first voltage level; and configuring an index of an entry of the plurality of entries storing a simulated output count that most closely matches the actual output count as the process parameter.

17. A method comprising:

providing a supply voltage and a body-biasing voltage to a digital circuit of an electronic device;

determining a process parameter of the digital circuit based on an operation of a ring oscillator of the electronic device at a first voltage level of the supply voltage;

determining a current temperature parameter of the digital circuit based on an operation of the ring oscillator at a second voltage level of the supply voltage, the second voltage level lower than the first voltage level; and configuring a level for the supply voltage and a level for the body-biasing voltage based on the process parameter, the current temperature parameter, and a frequency of a clock signal provided to the digital circuit, wherein determining the current temperature parameter comprises:

populating each entry of a plurality of entries of a temperature map with a temperature value determined from a simulation of a design of the ring oscillator at different process nodes of a plurality of processing nodes;

determining an actual output count of the ring oscillator when supplied with a voltage having the second voltage level;

selecting a row of the temperature map based on the actual output count; and configuring the temperature value stored at an entry of the plurality of entries of the row that is associated with the process parameter as the current temperature parameter.

18. A method comprising:
providing a supply voltage and a body-biasing voltage to a digital circuit of an electronic device;
determining a process parameter of the digital circuit based on an operation of a ring oscillator of the electronic device at a first voltage level of the supply voltage;
determining a current temperature parameter of the digital circuit based on an operation of the ring oscillator at a second voltage level of the supply voltage, the second voltage level lower than the first voltage level; and
configuring a level for the supply voltage and a level for the body-biasing voltage based on the process parameter, the current temperature parameter, and a frequency of a clock signal provided to the digital circuit,
wherein configuring a level for the supply voltage comprises:
populating each entry of a plurality of entries of a supply voltage map with a voltage value determined from a simulation of a design of a critical path replica circuit at different process nodes of a plurality of processing nodes, at different temperature levels, and at different supply voltage levels;
selecting a row of the supply voltage map based on the frequency of the clock signal and based on the current temperature parameter;
selecting an entry of the row based on the process parameter; and
configuring the level for the supply voltage based on the voltage value stored at the selected entry of the selected row.

* * * * *